US007353587B2

(12) United States Patent
Vinciarelli et al.

(10) Patent No.: US 7,353,587 B2
(45) Date of Patent: Apr. 8, 2008

(54) FORMING DISTRIBUTED GAP MAGNETIC CORES

(75) Inventors: Patrizio Vinciarelli, Boston, MA (US); Eva M. Kenny-McDermott, Sudbury, MA (US)

(73) Assignee: VLT, Inc., Sunnyvale, CA (US)

( * ) Notice: Subject to any disclaimer, the term of this patent is extended or adjusted under 35 U.S.C. 154(b) by 187 days.

(21) Appl. No.: 10/978,609

(22) Filed: Nov. 1, 2004

(65) Prior Publication Data

US 2006/0091989 A1 May 4, 2006

(51) Int. Cl.
H01F 7/127 (2006.01)

(52) U.S. Cl. .............. 29/602.1; 29/603.06; 29/603.2; 29/417; 336/216; 336/234

(58) Field of Classification Search .............. 29/602.1, 29/603.06, 603.2, 603.21, 603.22, 412, 417; 360/119, 121, 122; 336/234, 216, 218; 219/121.67, 219/121.69
See application file for complete search history.

(56) References Cited

U.S. PATENT DOCUMENTS

| | | | | |
|---|---|---|---|---|
| 3,842,494 A | * | 10/1974 | Chiba et al. | ......... 29/603.21 X |
| 5,022,140 A | * | 6/1991 | Tsutaki et al. | ....... 29/603.21 X |
| 5,062,197 A | | 11/1991 | Ngo et al. | |
| 5,309,306 A | * | 5/1994 | Okada et al. | ................ 360/121 |
| 6,120,916 A | | 9/2000 | Delvinquier et al. | |

FOREIGN PATENT DOCUMENTS

JP 56-32714 * 4/1981 .................. 336/218

OTHER PUBLICATIONS

Dugas et al., "A New Composite-Core Hybrid Thin Film Ring Head", IEEE Transactions on Magnetics, vol. MAG-23, No. 5, Sep. 1997, pp. 2407-2409.*
"Pressure-Sensitive Adhesive Tape for Water Jet-Guided Laser Dicing Process," Introduction of New Products, Furukawa Review, No. 22, 2002, pp. 1-2.
Bernold Richerzhagen, "Industrial Applications of the Water-Jet Guided Laser," Lasers in Manufacturing, The Industrial Laser User, Issue 28, Sep. 2002, pp. 28-30.

(Continued)

Primary Examiner—A. Dexter Tugbang
(74) Attorney, Agent, or Firm—Fish & Richardson P.C.

(57) ABSTRACT

A method of manufacturing a magnetic core includes providing a substrate with magnetically permeable material that has a first region and a second region near the first region, providing support to maintain a juxtaposition between the first region and the second region, forming a slit through the magnetically permeable material between the first region and the second region, introducing a binding agent into the slit and removing the support; wherein the binding agent maintains the juxtaposition between the first region and the second region after the support is removed.

26 Claims, 15 Drawing Sheets

OTHER PUBLICATIONS

Bernold Richerzhagen, The Best of Both Worlds—Laser and Water Jet Combined in a New Process: The Water Jet Guided Laser, International Congress on Applications of Laser and Electro-Optics, Oct. 2001 Jacksonville, Florida.

Jiankun Hu et al., "AC Resistance of Planar Power Inductors and the Quasidistributed Gap Technique," IEEE Transactions on Power Electronics, vol. 16, No. 4, Jul. 2001, pp. 558-567.

Jiankun Hu et al., "The Quasi-Distributed Gap Technique for Planar Inductors: Design Guidelines," IEEE Industry Applications Society, Annual Meeting, New Orleans, LA, Oct. 1997.

Waseem A. Roshen, et al., "High-Efficiency, High-Density MHz Magnetic Components for Low Profile Converters," IEEE Transactions on Industry Applications, vol. 31, No. 4, Jul./Aug. 1995, pp. 869-878.

* cited by examiner

View A-A

View B-B    Detail View

FORMING DISTRIBUTED GAP MAGNETIC CORES

TECHNICAL FIELD

This invention relates to magnetic cores, and more particularly to magnetic cores having discretely distributed gaps.

BACKGROUND

Gapped magnetic cores are well known in the art. An example of a gapped magnetic core is shown in FIG. 14. In FIG. 14, a magnetic core 2 comprises a portion made of a first permeable material 4 having a relative magnetic permeability $\mu_{R1} > 1$ and a gap 6 comprising a second material having a relative magnetic permeability $\mu_{R2} < \mu_{R1}$. In a typical example, the first magnetic material might be a ferrite having a $\mu_{R1} > 100$ and the second material might be air, plastic or epoxy having a $\mu_{R2} = 1$.

In the absence of a gap, energy storage in a permeable core may be limited by the onset of core saturation. By including a gap in the magnetic core, the amount of energy that may be stored in a given volume at a given flux level may be increased.

Gaps may provide for improved inductive energy density but are not without drawbacks. One problem associated with gaps may be the presence of fringing fields in the region of the gap. FIG. 15, for example, shows a schematic side view of magnetic lines of flux in the region of the gap 6 of the magnetic core 2 of FIG. 14. As shown in FIG. 15, the flux, illustrated schematically by the dashed arrows, is essentially fully constrained within the confines of the relatively high permeability first material 4 but may "fringe" out into the region surrounding the low permeability gap 6. If the length of the gap (dimension G, FIGS. 14, 15) is very small, the amount of fringing may be small. As the gap 6 is made larger, however, the fringing field may spread out further in the region of the gap 6. This may cause a variety of problems: for example, time varying flux in the fringing field may couple into nearby circuitry causing interference and heat losses.

A variety of methods may be used to set discrete gaps in magnetic structures. In one method, one or more discrete gaps are formed by controlling the physical relationship between two magnetic core pieces. For example, the magnetic core 8 of FIG. 16 comprises two magnetic core pieces 10, 12. Two gaps 14, 16 may be formed at the two locations at which the two magnetic core pieces are joined. It may be important to carefully control the length of the gaps to produce desired values for inductance per turn and energy storage capacity of the resulting magnetic core 8. One way to control the length of the gaps may be to use epoxy that is loaded with non-permeable, non-conductive, spherical bodies (e.g., glass or plastic) of a fixed diameter (e.g., 0.4 mil to 10 mil). For example, glass spheres manufactured by Potters Industries Inc., Valley Forge, Pa. USA may be suitable for use in such an application. As the core pieces are brought together, the gaps may be limited to the diameters of the spherical bodies in the epoxy. Another way to form gaps may be to glue spacers of pre-determined thickness between the core pieces, however this may require careful control over the thickness of the glue line. Yet another way to set a gap is to place adhesive in the regions of the gaps and mechanically adjust the gaps between the core pieces 10, 12 while measuring the inductance of the magnetic core 8. When the inductance reaches a pre-determined value the adjustment may be stopped and the adhesive may be allowed to set.

One way to achieve the benefits of a relatively large gap may be to distribute the gap over the length of the magnetic core in the form of a plurality of smaller gaps. By combining several small gaps, substantially increased energy storage may be achieved with, for example, lower fringing field effects than might otherwise be associated with a single, larger, gap.

The use of discretely distributed (also known as quasidistributed) gaps in magnetic cores is discussed generally in Jiankun Hu and Charles R. Sullivan, *The Quasi-Distributed Gap Technique for Planar Inductors: Design Guidelines*, IEEE Industry Applications Society, Annual Meeting (Oct. 5, 1997) and in Jiankun Hu and Charles R. Sullivan, *AC Resistance of Planar Power Inductors and the Quasidistributed Gap Technique*, IEEE Transactions on Power Electronics (July 2001).

The use of laser material processing with water-jet technology (the process is known as laser Microjet® dicing) has been described generally in Bernold Richerzhagen, *Industrial Applications of the Water-Jet Guided Laser*, The Industrial Laser User (September 2002). The use of adhesive tapes with laser Microjet® dicing has been described generally in *Pressure-Sensitive Adhesive Tape for Water Jet-Guided Laser Dicing Process*, Furukawa Review, No. 22 (2002).

Each of the above mentioned references are hereby incorporated by reference in their entireties.

SUMMARY

In general, one aspect features a method of manufacturing a magnetic core. The method includes providing a substrate that has a magnetically permeable material with a first region and a second region that is proximate the first region. Support is provided to maintain a juxtaposition between the first region and the second region. A slit is formed in the substrate between the first region and the second region and a binding agent is introduced into the slit. The support is removed and the binding agent maintains the juxtaposition between the first region and the second region after the support is removed.

Implementations of the method may include one or more of the following features. Support may be provided by using a portion of the substrate that connects the first region and the second region as a bridge to maintain the juxtaposition between the first region and the second region after the slit is formed. In that case, removing the support may include removing the portion of the substrate.

The method may include forming a plurality of slits with each pair of adjacent slits defining an intermediate region of substrate disposed there between. Support may then be provided to maintain a juxtaposition between the first region, the second region and each intermediate region. The binding agent may maintain the juxtaposition between the first region, the second region and each intermediate region after the support is removed.

Introducing the binding agent may include filling the slit with binding agent. The binding agent may be cured or set, as required. The substrate may be a ferrite wafer or be in another suitable form. The slit may be formed using a laser. The method may also include polishing at least one of the surfaces of the wafer after (or before) the slit is filled.

Support may be provided by securing a support element to the substrate using, for example, an adhesive to bond the support element to the substrate. The support element may be largely impervious to damage during slit formation.

The method may include forming a plurality of slits between the first and second region in the substrate and introducing the binding agent into each of the slits. Each pair of adjacent slits may define an intermediate region of substrate material between that pair of slits. The method may include providing support to maintain a juxtaposition between the first region, the second region and each intermediate region. Providing support may include using a portion of the substrate as a bridge to maintain the juxtaposition between the first region, the second region and each intermediate region after the plurality of slits is formed, and removing the support may include removing the portion of the substrate. The plurality of slits may be substantially parallel to adjacent slits and each slit may be separated from an adjacent slit by an intermediate region of substrate. The method may include curing or setting the binding agent. The substrate may be cut into a plurality of core pieces. Each core piece may have a respective first region, a respective second region, and at least one gap filled (or partially filled) with binding agent between the respective first and second regions.

A closed loop of magnetically permeable material may be formed that includes at least one gap in the magnetically permeable material for storing energy. The loop may include a first element including at least one of the plurality of core pieces and a second element. At least 80% of the energy storage may be provided by the filled slits in the at least one of the core pieces. An essentially gapless interface may be disposed between the first element and the second element. The essentially gapless interface may be, for example, less than 20% of the total gap in the closed loop, less than 15%, less than 10%, less than 5%, less than 4%, or less than 1% of the total gap in the closed loop. The second element may be U shaped or E shaped. Each of the plurality of core pieces may include two first regions and a second region that is separated from each first region by an associated plurality of slits. Each of the plurality of slits is filled with binding agent. The binding agent that is used may have a magnetic permeability that is equivalent to air.

In general, another aspect features a wafer that includes a magnetically permeable material and a plurality of slits through the magnetically permeable material. The slits may be arranged in groups, with each group defining an individual magnetic core configuration. A binding agent may be disposed within each of the plurality of slits.

In general, another aspect features a magnetic core having a first core element with a section having discretely distributed gaps. A second core element may be positioned proximate the first core element to define at least one essentially gapless interface there between. A current carrying conductor may be positioned proximate the first and second core elements to induce a magnetic field within the first and second core elements. At least 80% of energy associated with the induced magnetic field may be stored at the discretely distributed gaps.

In general, another aspect features a method for providing a gapped magnetic core for incorporation in a corresponding one of a plurality of electronic circuits being manufactured on a production line. The method may include providing a supply of second core pieces and providing a supply of first core pieces. The supply of first core pieces may be a number, N, of different first core pieces. Each of the different first core pieces may have a discretely distributed gap. The method may include selecting a first core piece from the N different first core pieces according to pre-determined criteria, selecting a second core piece and positioning, within the corresponding one of the plurality of electronic circuits, the selected first core piece proximate the selected second core piece to define at least one essentially gapless interface there between.

Implementations of the method may include one or more of the following features. The method may include applying adhesive to the core pieces in the region of the essentially gapless interface. The first core pieces may comprise I-core pieces and the second core pieces may comprise E-core pieces. The first core pieces may comprise I-core pieces and the second core pieces may comprise U-core pieces. The step of selecting may be based upon the model number of the corresponding one of the plurality of electronic circuits.

Certain implementations may result in one or more of the following advantages.

The production of magnetic cores having quasidistributed gaps may be greatly simplified. The costs associated with such production also may be reduced. Additionally, the speed with which production may be accomplished may be enhanced.

The complexity of equipment required to manufacture magnetic cores having quasidistributed gaps may be reduced. The costs associated with purchasing, installing and maintaining such equipment may also be reduced. Furthermore, simplified production systems may realize enhanced reliability.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings may indicate like elements.

DETAILED DESCRIPTION

Figure 1:
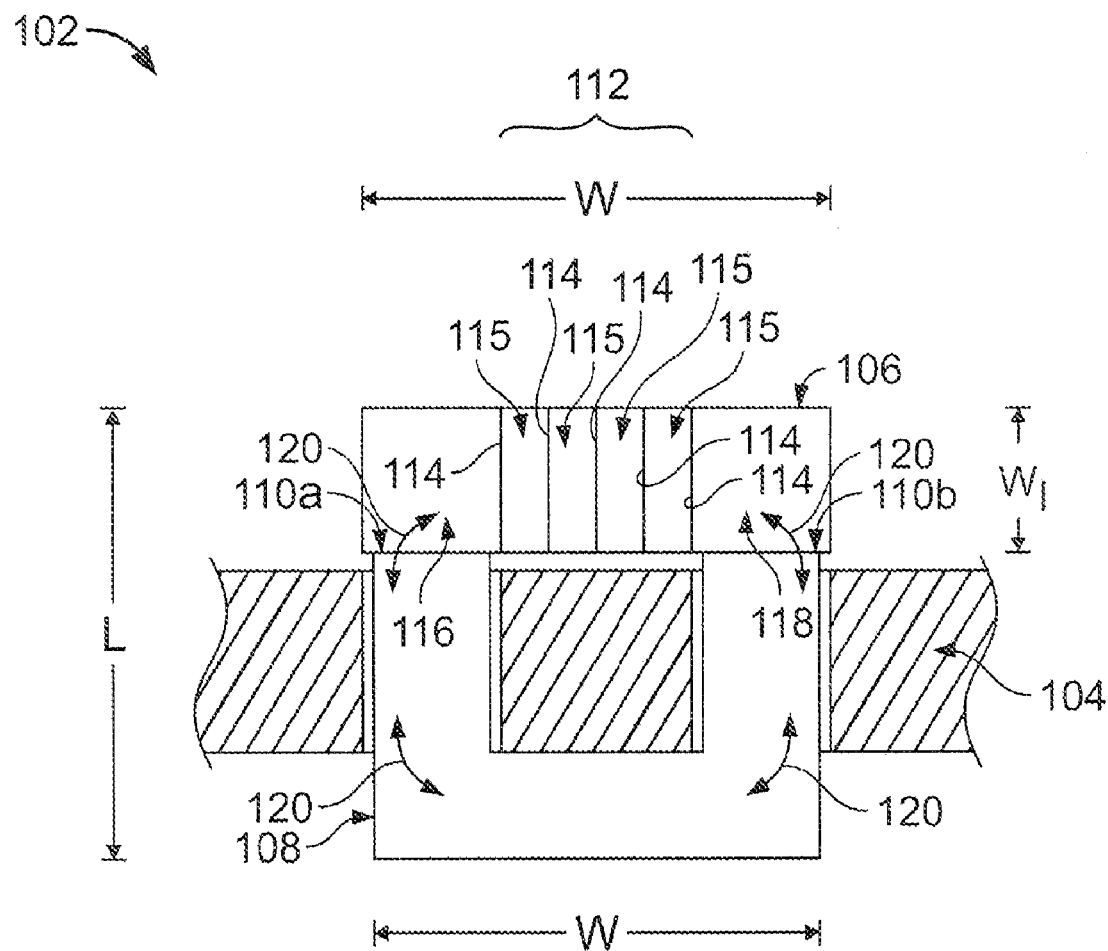
FIG. 1 is a cross sectional view of a magnetic core proximate a printed circuit board.

FIG. 1 illustrates a printed circuit board ("PCB") transformer including a magnetic core 102 forming a closed loop of magnetically permeable material and positioned proximate a PCB 104. The magnetic core 102 is shown including a first core element 106 mated with a second core element 108. As shown, the first core element 106 may be an I-core element and the second core element 108 may be a U-core element. Due to the shape of the respective core elements 108 and 106, the illustrated embodiment is commonly called a U-I core. Other core configurations, such as for example E-I cores, are also possible.

The first core element 106 may be formed from a substrate with a section 112 comprising a number of discretely distributed gaps formed between a first region 116 and a second region 118 of the substrate. The substrate may be a magnetically permeable material or may be a composite including some magnetically permeable material. The second core element 108 also may be formed from a substrate of either magnetically permeable material or a composite containing some amount of magnetically permeable material.

The distributed gap section 112 may include a plurality of slits 114 passing entirely through the magnetically permeable material, as shown. Each slit 114 may be filled (or partially filled) with a binding agent such as an adhesive epoxy, preferably having a high glass transition temperature and a low coefficient of thermal expansion. For example, the binding agent 318 may have a coefficient of thermal expansion in the range of 10-50 parts per million (ppm). The binding agent 318 may have a glass transition temperature, for example, that is greater than approximately 150° C. The binding agent 318 may contain a suitable low particle size ceramic or glass filler to stabilize mechanical properties. Alternatively, the binding agent 318 may be unfilled. The binding agent 318 may be capable of forming a strong adhesive bond with ferrite surfaces, and may exhibit mechanical stability at temperatures greater than 120° C. Suitable binding agents 318 may include LCA48 and LCA9 epoxies manufactured by Bacon Industries, Watertown, Mass., USA; T6081 epoxy manufactured by Epoxy Technology, Billerica, Mass., USA; and Stycast E2502 and 2850MT epoxies manufactured by Emerson and Cuming, Billerica, Mass., USA. The binding agent 318 may have a lower value of magnetic permeability than the magnetically permeable material of the substrate. Preferably, the binding agent 318 has the same magnetic permeably as air and is electrically non-conductive. Each pair of adjacent slits 114 may define an intermediate region 115 disposed there between. Each intermediate region 115 may consist of substrate material.

Figure 12:
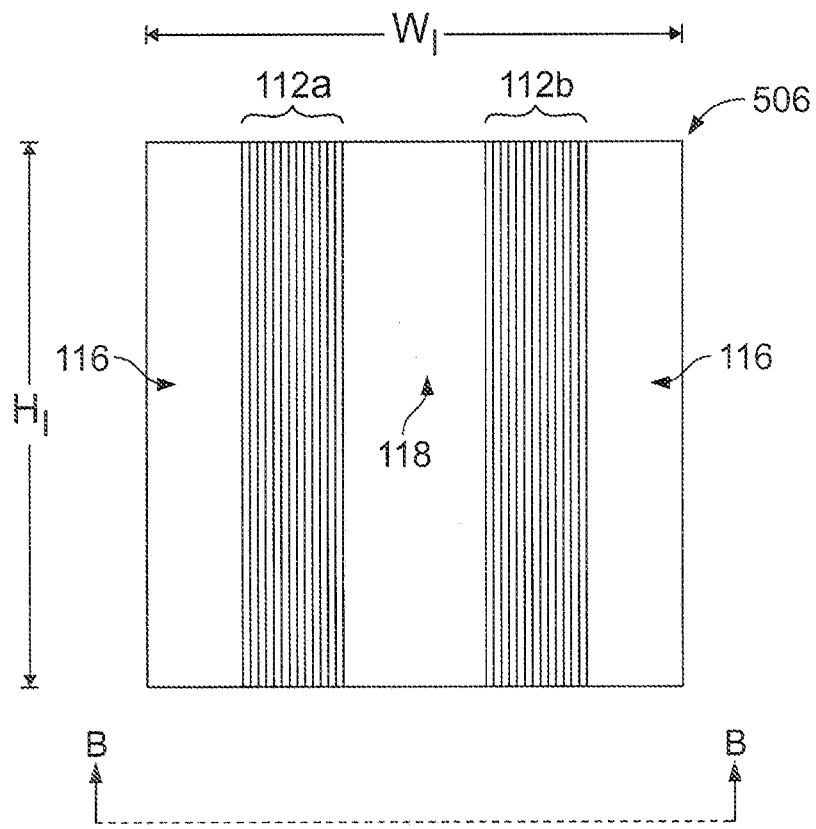
FIG. 12 illustrates an I-core element.
Figure 12:
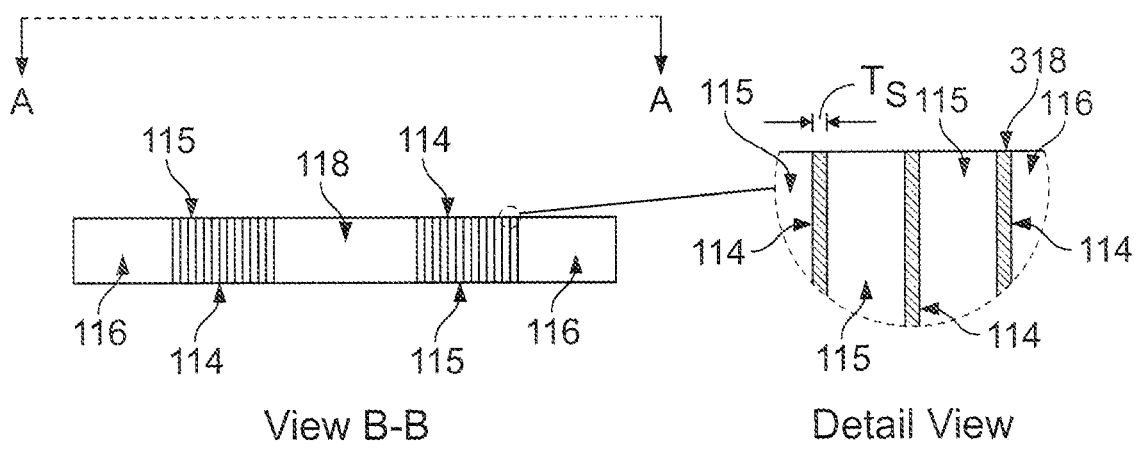
Figure 13:
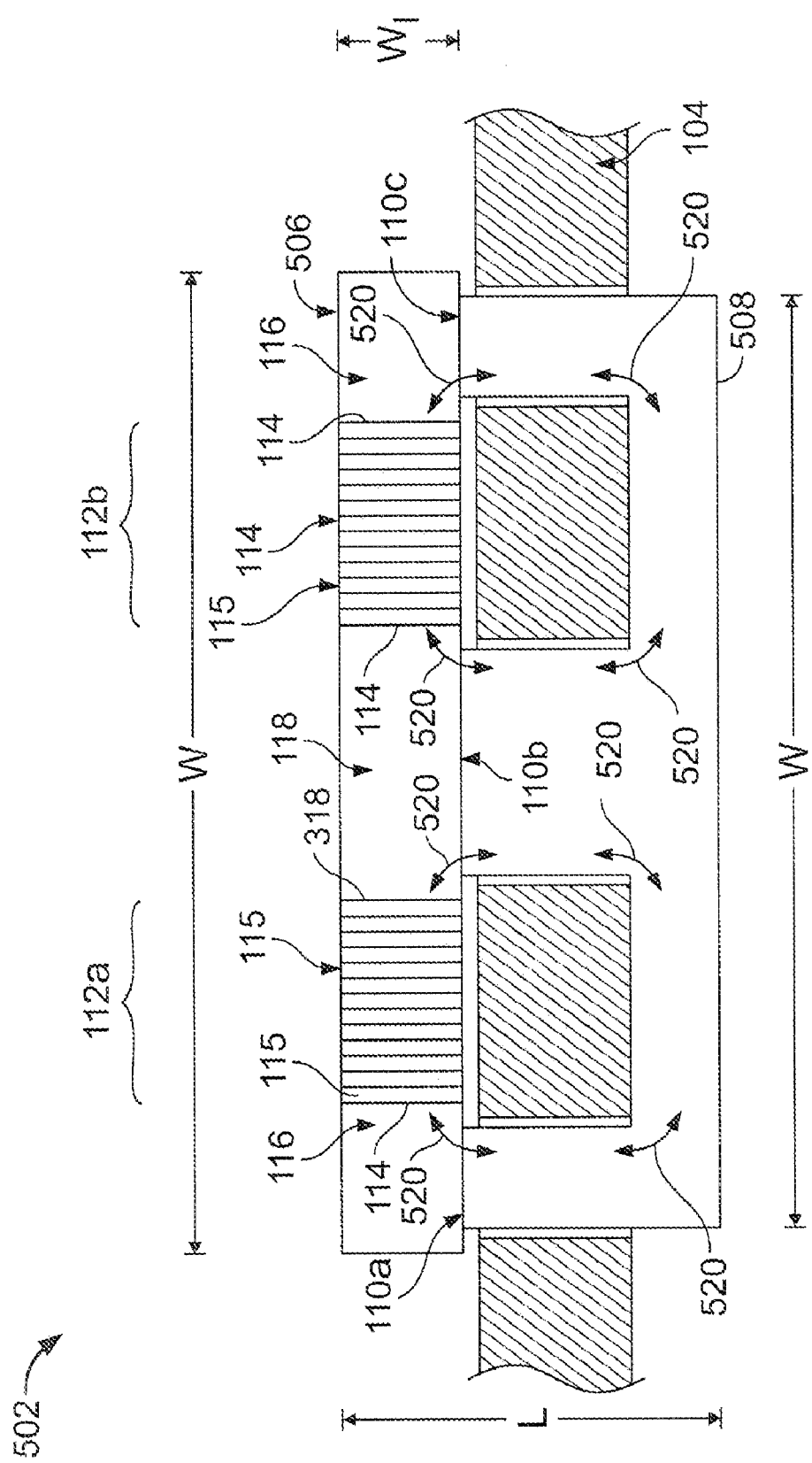
FIG. 13 is a cross sectional view of a magnetic core proximate a printed circuit board.
Figure 14:
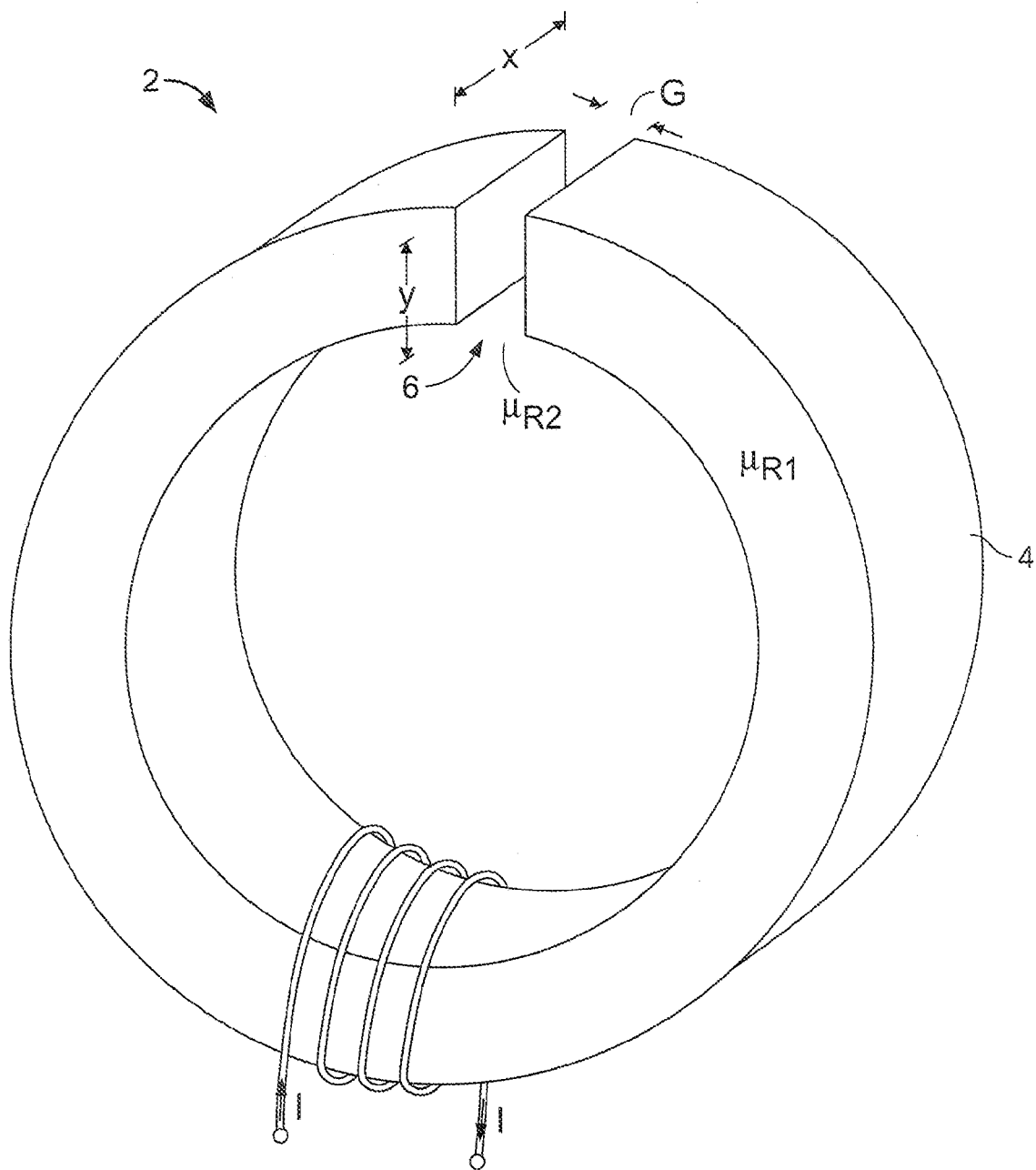
FIG. 14 illustrates a magnetic core with a gap.
Figure 15:
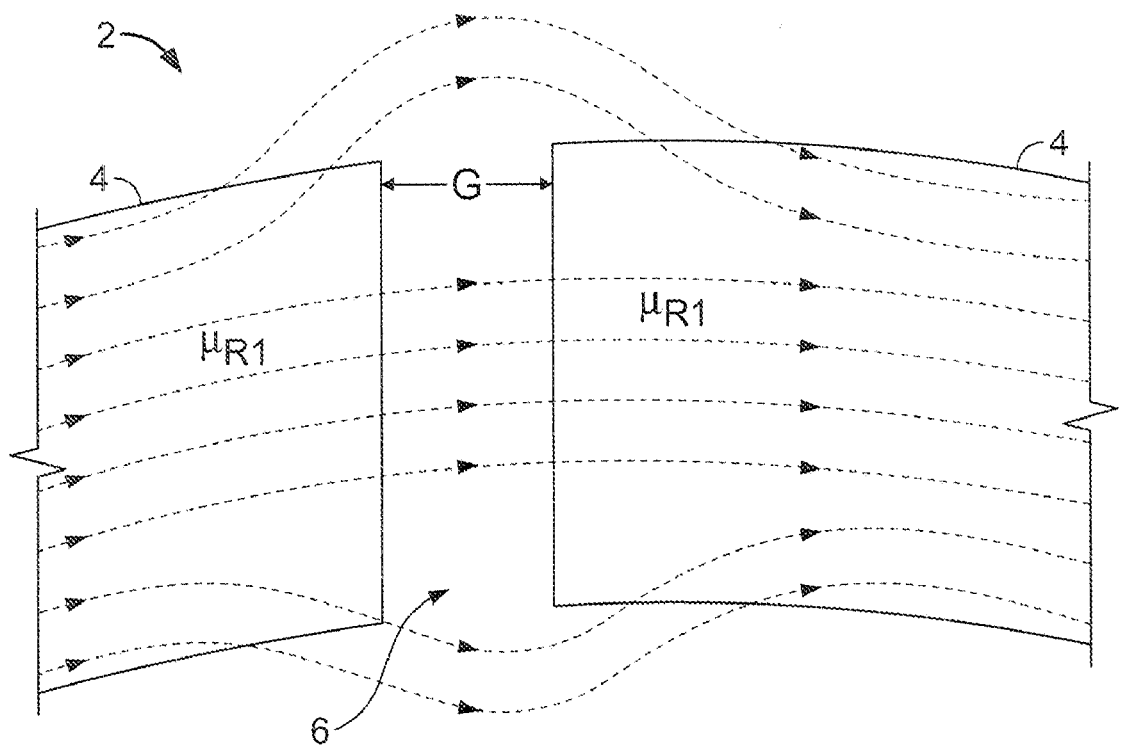
FIG. 15 illustrates a schematic view of flux in the region of a gap.

It should be understood that the distributed gap section 112 could include a greater or lesser number of slits 114 than are illustrated. As described below, and as illustrated in FIGS. 12 and 13, the first core element 106 may include more than one distributed gap section 112.

The PCB 104 may be positioned relative to the magnetic core 102 in such a manner that current flowing in certain parts of the PCB 104 may induce a magnetic field within the magnetic core 102. The flux path associated with an induced magnetic field is shown in FIG. 1 with arrows marked 120.

The core elements 106, 108 may be positioned to contact each other at two essentially gapless interfaces 110a and 110b as shown in FIG. 1. An essentially gapless interface may have little or no impact on the magnetic permeability of the magnetic core 102 as a whole. The interface may be characterized in terms of its energy storage relative to the energy storage of the entire core structure. For example, a gapless interface may be defined as providing less than a specified percentage (e.g., 20%) of the total energy storage of a gapped magnetic core, or alternatively, as providing less than a specified percentage (e.g., 20%) of the total gap length of a gapped magnetic core; Alternatively, the interface may be characterized as gapless if at least a specified percentage (e.g., 80%), of the total energy storage of the core structure is provided by the distributed gap section 112.

Figure 2:
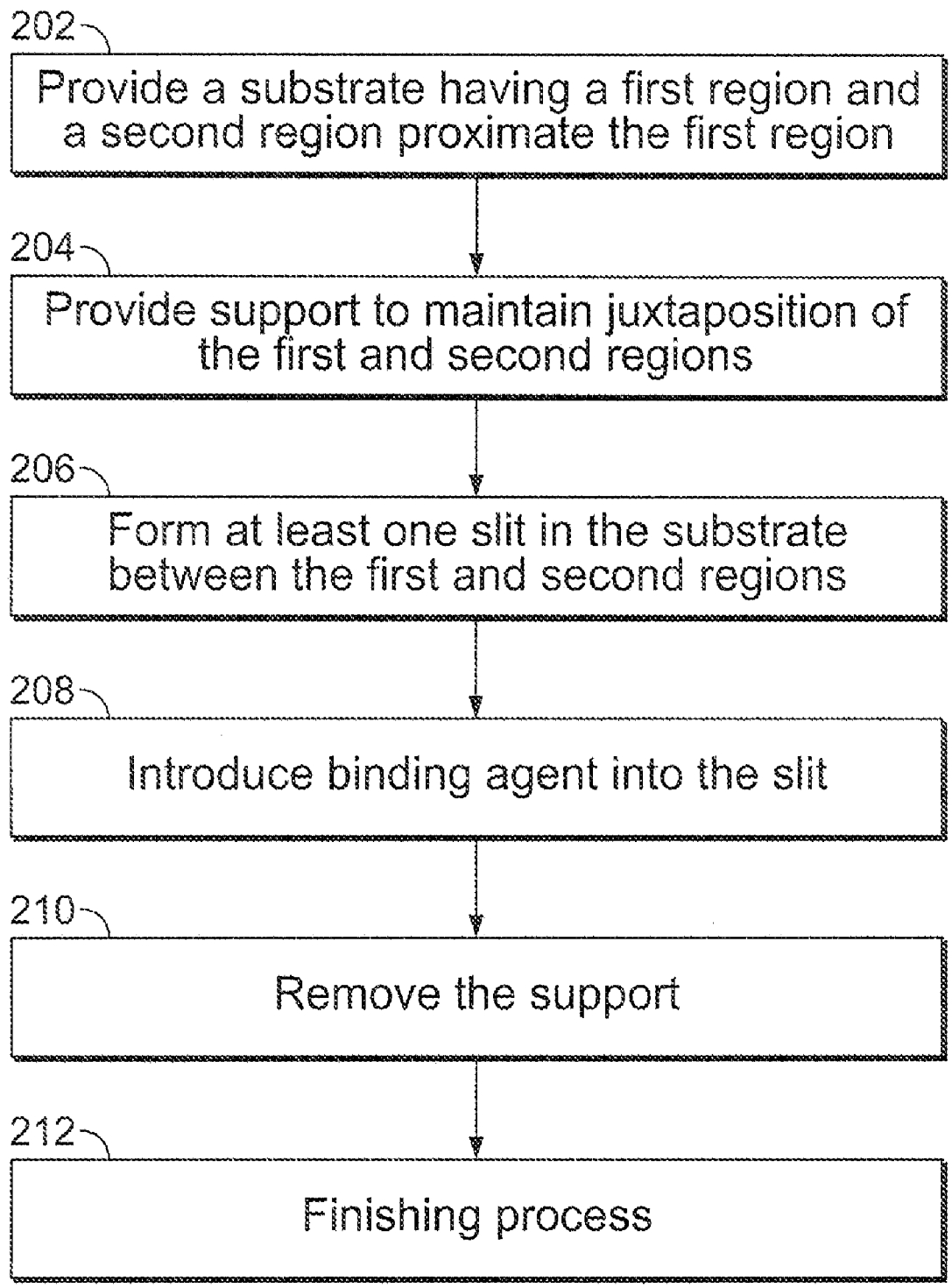
FIG. 2 is a flowchart of a method of manufacturing a magnetic core.
Figures 3A, 3B:
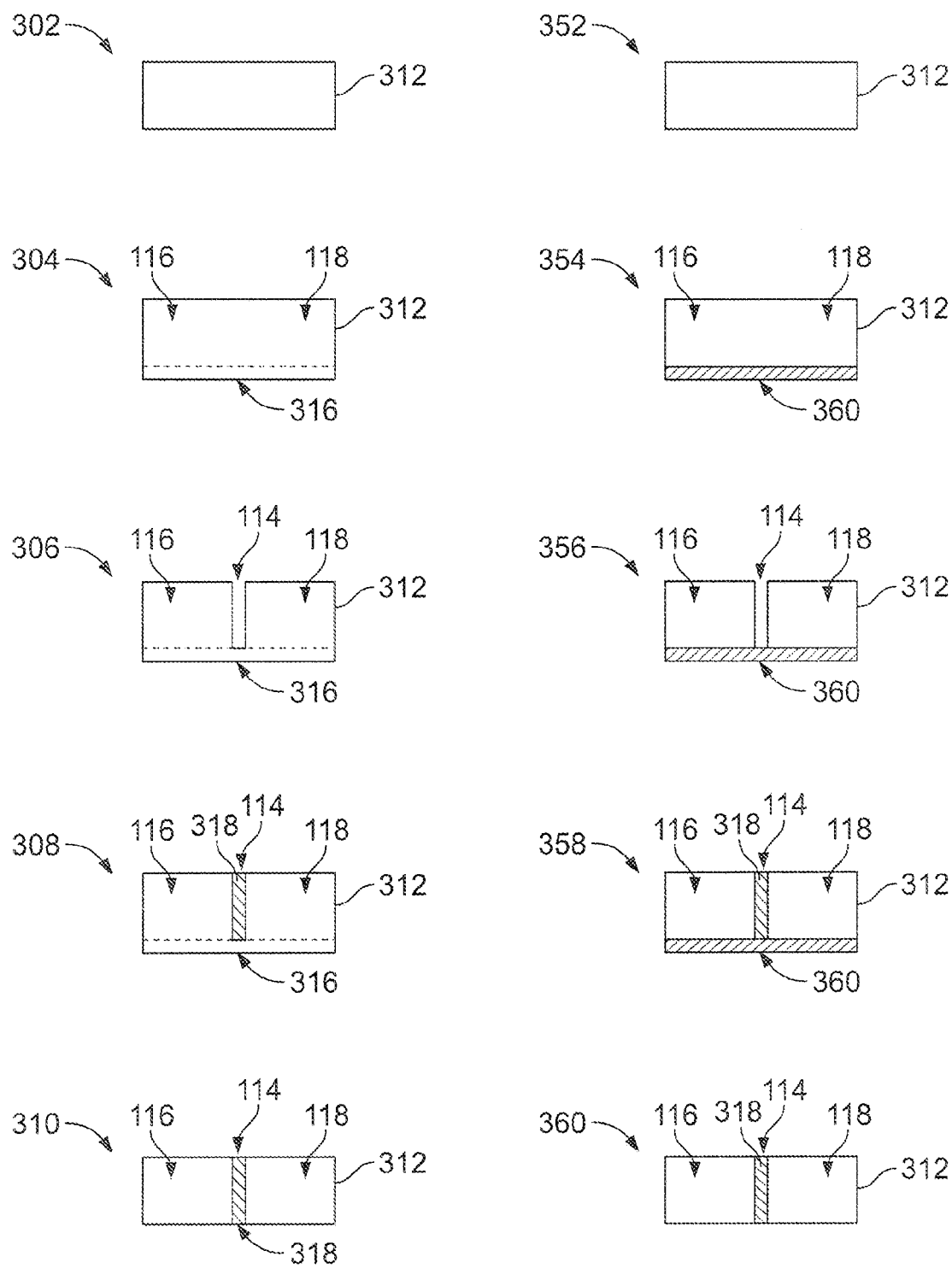
FIGS. 3A and 3B illustrate a substrate during various stages of processing according to a method of manufacturing a magnetic core.

Referring to FIGS. 2, 3A, and 3B, methods of manufacturing a magnetic core element 106 (FIG. 1) having a discretely distributed gap section 112 will be described. A substrate 312 including magnetically permeable material is provided in step 202 (FIG. 2), 302 (FIG. 3A), and 352 (FIG. 3B). The substrate 312 may be provided as a ferrite plate or wafer. Alternatively, the substrate may be provided in another form suitable for manufacturing magnetically permeable cores, such as, a toroid. The substrate 312 may consist entirely of magnetically permeable material. Alternatively, the substrate 312 may be a composite of magnetically permeable material and non-magnetically permeable material. The substrate includes a first region (e.g., 116 in FIG. 1) and a second region (e.g., 118 in FIG. 1) proximate the first region 116.

The substrate 312 is supported in step 204 (FIG. 2), 304 (FIG. 3A), and 354 (FIG. 3B) to maintain the juxtaposition of the pieces of the substrate (e.g., first region 116, second region 118, and any intermediate regions 115 between slits 114 that are formed in the substrate (see, e.g., FIGS. 1 and 13)) while slits are being formed and filled (or partially filled). Support may be provided, for example, by attaching a support element 360 (FIG. 3B) to the substrate 312. Suitable support elements 360 may include, for example, dicing sheets/ring frames, such as part number FS1006 from Synova SA, Switzerland or part number FS1006 from Semiconductor Equipment Corporation, Moorpark, Calif., USA. Alternatively, support may be provided by designating a portion 316 (FIG. 3A) of the substrate 312 to act as a bridge and provide the requisite support.

In step 206 (FIG. 2), 306 (FIG. 3A) and 356 (FIG. 3B), at least one slit 114 is formed in the substrate 312 between the first 116 and second 118 regions. The slit 114 may be formed, for example, using a laser Microjet® available from Synova SA, a laser from a company such as Synrad Inc., Mukilteo, Wash., USA, a dicing saw such as model number MSS816 from MTI Corporation, Richmond, Calif., USA, by chemical etching, or by laser enhanced chemical etching. During slit 114 formation, the juxtaposition of the first 116 and second 118 regions may be maintained by the support element 316 (FIG. 3A) or 360 (FIG. 3B).

Multiple slits 114 may be formed in the substrate 312, with each pair of adjacent slits 114 defining an intermediate region 115 (FIG. 1) of substrate material there between. If multiple slits 114 are formed, the juxtaposition of the first 116, second 118 and any resulting intermediate regions 115 may be maintained by a support element 316 (FIG. 3A) or 360 (FIG. 3B).

After the slit 114 is formed in the substrate 312, binding agent 318 may be introduced into the slit 114 at step 208 (FIG. 2), 308 (FIG. 3A) and 358 (FIG. 3B). In certain instances, the slit 114 may be filled with binding agent. The binding agent 318 may be applied, for example, in a liquid form or a paste form. Alternatively, the binding agent 318 may be applied in the form of a high flow, B-stage film adhesive. The binding agent 318 may be applied directly to a surface of the substrate 312. Once applied, the binding agent 318 may be permitted to seep into the slit 114 via capillary action. Alternatively, the binding agent 318 may be pushed into the slit 114 using a squeegee. Yet another option might be to apply the binding agent 318 to a surface of the substrate 312 and expose the substrate 312 to an elevated temperature and pressure to urge the binding agent 318 into the slit 114.

If required, the binding agent 318 may be cured. Preferably, curing may be accomplished in such a manner as to reduce or eliminate stress and to stabilize the mechanical properties of substrate 312. For example, B-stage film adhesive, part number TF12500F, from TechFilm Services Inc., Peabody, Mass., USA or Bacon Industries liquid epoxies, part numbers LCA9 or LCA48, may be cured at a temperature of between 150 C. and 200 C. Alternatively, the binding agent 318 may simply be allowed to set if curing is not required.

After the binding agent 318 is set or cured as the case may be, the support 316 or 360 maybe removed as shown instep 210 (FIG. 2), 310 (FIG. 3A) and 360 (FIG. 3B). In applications using a portion 316 of the substrate as the support element (FIG. 3A), the portion 316 may be removed for example by cutting, grinding, or polishing either the entire surface of the substrate or a region of the substrate local to the slit 114. If a non-magnetically permeable portion of the substrate was used to provide the support, then that non-magnetically permeable portion may be left intact or removed according to the requirements of the specific application.

In some instances, it may be desirable to perform finishing process steps on the substrate as shown in step 212. Finishing process steps may include adding and optionally curing or setting supplemental binding agent 318 to the slit 114, removing excess binding agent 318 that extends beyond the slit 114 or that has adhered to a surface of the substrate 312, polishing the substrate, or cleaning the substrate 312, especially the region of the substrate 312 that will subsequently contact a corresponding second core element (e.g., 108 of FIG. 1). Finishing steps also may include shaping the substrate 312 to form the desired core element shape or dimensional configuration. For example, the finishing process may include polishing the substrate and cutting the substrate into individual core elements such as the I-core element 106 shown in FIG. 1.

After the core element (e.g., I-core element 106 in FIG. 1) is completed, it may be combined with additional core elements to form the requisite core configuration (e.g., placed proximate a second core element 108 to produce the U-I configuration shown in FIG. 1). A low viscosity epoxy or cyanoacrylate adhesive may be applied at one or both of the interfaces 110a, 110b between the two elements 106, 108 to bond the core elements at the interfaces 110a, 110b. An adhesive epoxy may also be applied along the outside circumference of the core elements 106, 108 near one or both interfaces 110a, 110b to enhance the mechanical strength of the bond between elements 106, 108, especially for essentially gapless interfaces. Additional mechanical support may also be achieved by underfilling the entire core/cap structure with a low viscosity underfill epoxy, which also may act to reduce mechanical stress between PCB, ferrite elements and an overmold component or encapsulant.

The method may be easily adapted to produce core elements in large quantities. Referring to FIGS. 4 through 8 a ferrite wafer is shown at various stages of a manufacturing process adapted to mass produce distributed gap core elements (e.g. I-core elements 106 as shown in FIG. 1).

Figure 4:
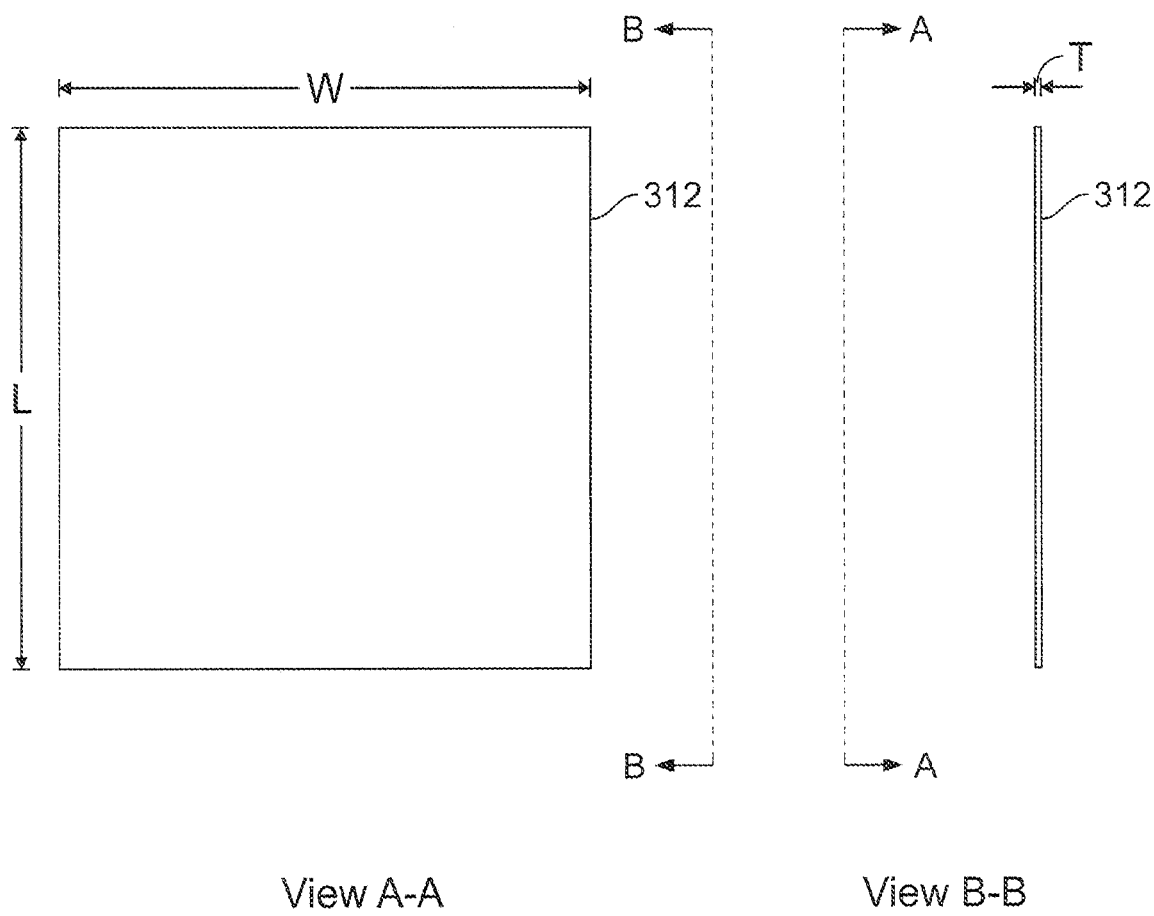
FIG. 4 illustrates a substrate.

Referring to FIG. 4, a substrate 312 is illustrated. The mass production method may start with providing the substrate 312 in the form of a ferrite wafer comprising a magnetically permeable material. Alternatively, the wafer may consist of layers including a laminate construction incorporating a multiplicity of magnetically permeable materials separated by a non-magnetically permeable material. As illustrated, the substrate 312 may be provided in the form of a wafer have a width W, e.g., 4 inches, and a length L, e.g., 4 inches, and a thickness, Z, e.g., 0.065 inches. Specific dimensions may, of course, vary according to specific applications.

Figure 5:
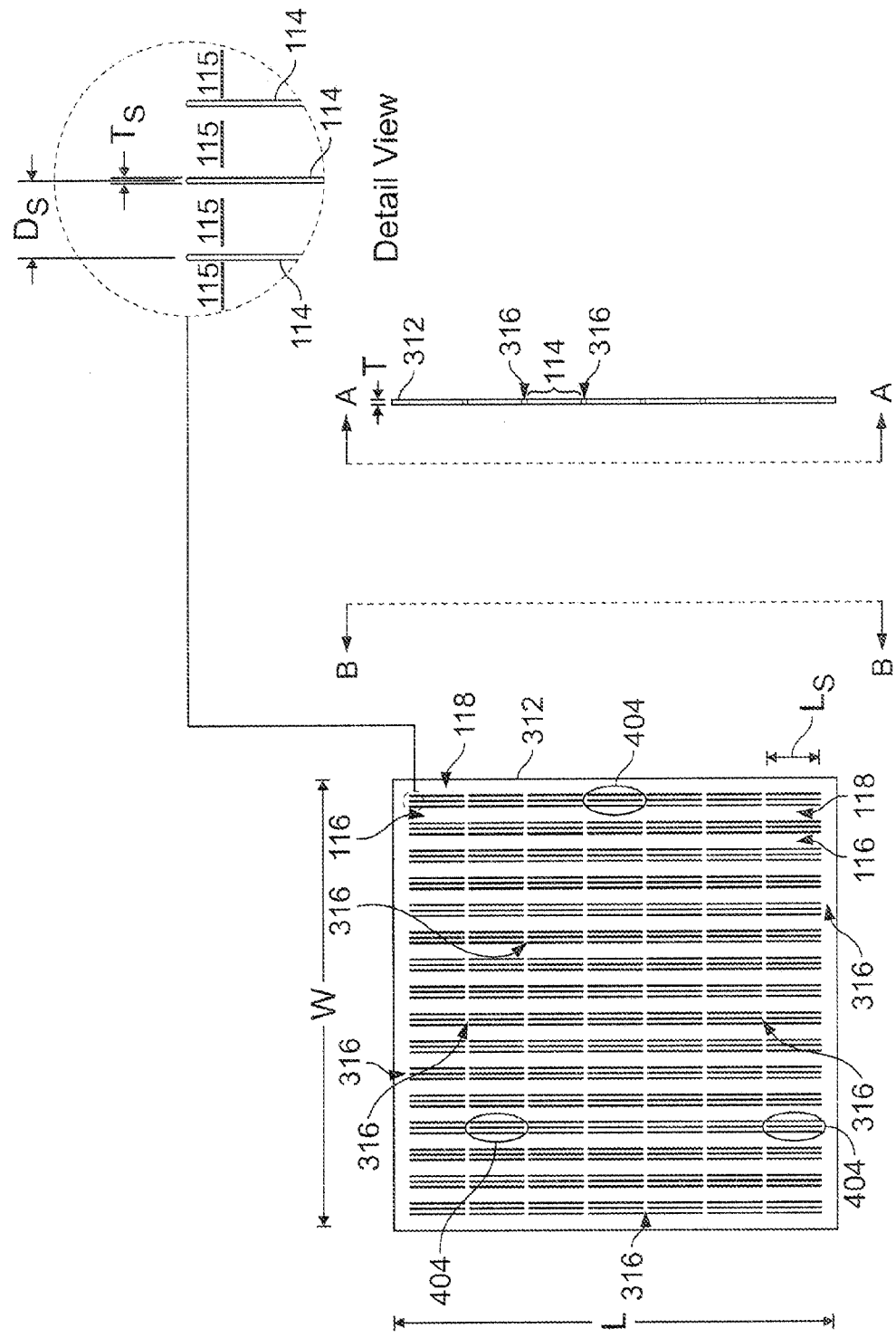
FIG. 5 illustrates a substrate with slits.

Turning now to FIG. 5, a plurality of distributed gap sections 404 are shown formed in the wafer 312 (step 206). Each distributed gap section 404 comprises a plurality of slits 114. As shown in FIG. 5, view B-B, each slit 114 passes entirely through the thickness of the substrate 312. Alternatively, each slit may pass through only a portion of the substrate thickness. The slits 114 may be formed as described above using a laser Microjet®, a laser or a cutting saw. Each distributed gap section 404 in FIG. 5 corresponds to a distributed gap section 112 of an individual I-core element as shown in FIG. 1. As shown, distributed gap sections 404 are arranged in a matrix of 16 columns and 7 rows. Accordingly, 112 (16×7=112) individual I-core configurations of the type shown in FIG. 1 may be fabricated from the single wafer 312 shown in FIG. 5. According to the illustrated embodiment, each slit 114 has a thickness $T_s$ that may, for example, be approximately 0.001 inches and a length $L_s$ that may be approximately 0.476 inches. Additionally, each slit in each distributed gap section 404 may be spaced a distance $D_s$ from adjacent, parallel slits 114. As shown in the detail view of FIG. 5, $D_s$ may be approximately 0.02 inches. Each group 404 of slits 114 may define a first region 116 of substrate 312 material that is adjacent the group 404 on one side and a second region 118 of substrate 312 material that is adjacent the group 404 on the other side. The distributed gap sections 404 are formed far enough apart on the wafer to provide space for the required first 116 and second 118 regions of the finished core element (FIG. 1). Each pair of adjacent slits 114 in the same group 404 also may define an intermediate region 115 disposed there between.

Support is provided (step 204) by a region of substrate 316 at the ends of each slit 114 to maintain the juxtaposition of first regions 116, second regions 118, and intermediate regions 115 during formation and filling (or partial filling) of the slits 114. As shown in FIG. 5, lateral support 316 is provided at the ends of the slits 114, in contrast to the bottom support 316 shown in FIG. 3A. Lateral support 316 in FIG. 5 may not be an option when available tooling does not allow formation of short discrete slits. In that case, the slits 114 may extend laterally across all or part of the wafer. Support may be provided at the bottom of the wafer either using a controlled cutting depth leaving a bottom portion 316 of the substrate as support or using an adhesive support member 360 as shown in FIGS. 3A and 3B, respectively.

Figure 6:
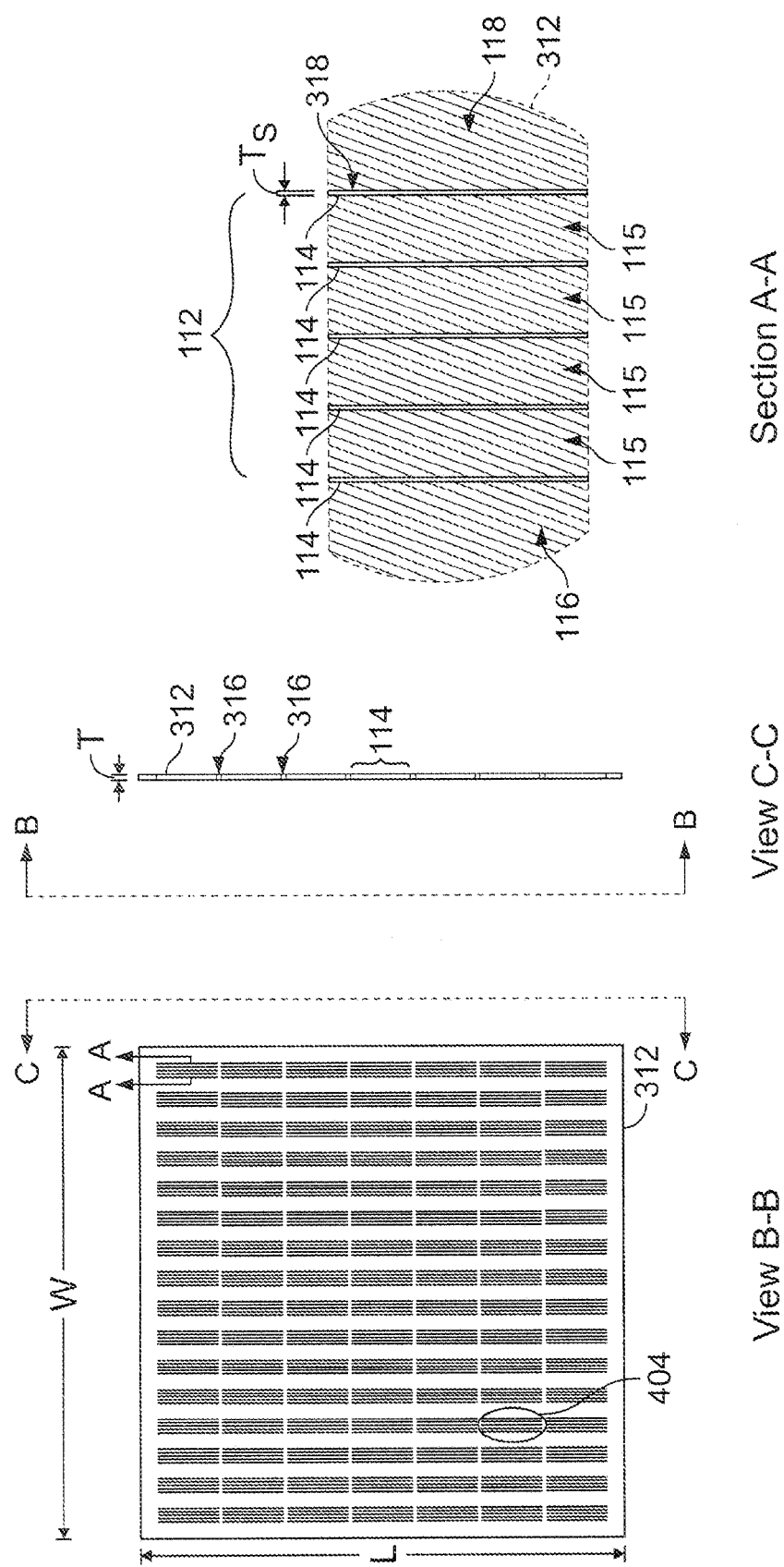
FIG. 6 illustrates a substrate with slits filled (or partially filled) with a binding agent.

A cross-section of one of the distributed gap sections 112, after introducing a binding agent (step 208) is shown in section A-A of FIG. 6

Figure 7:
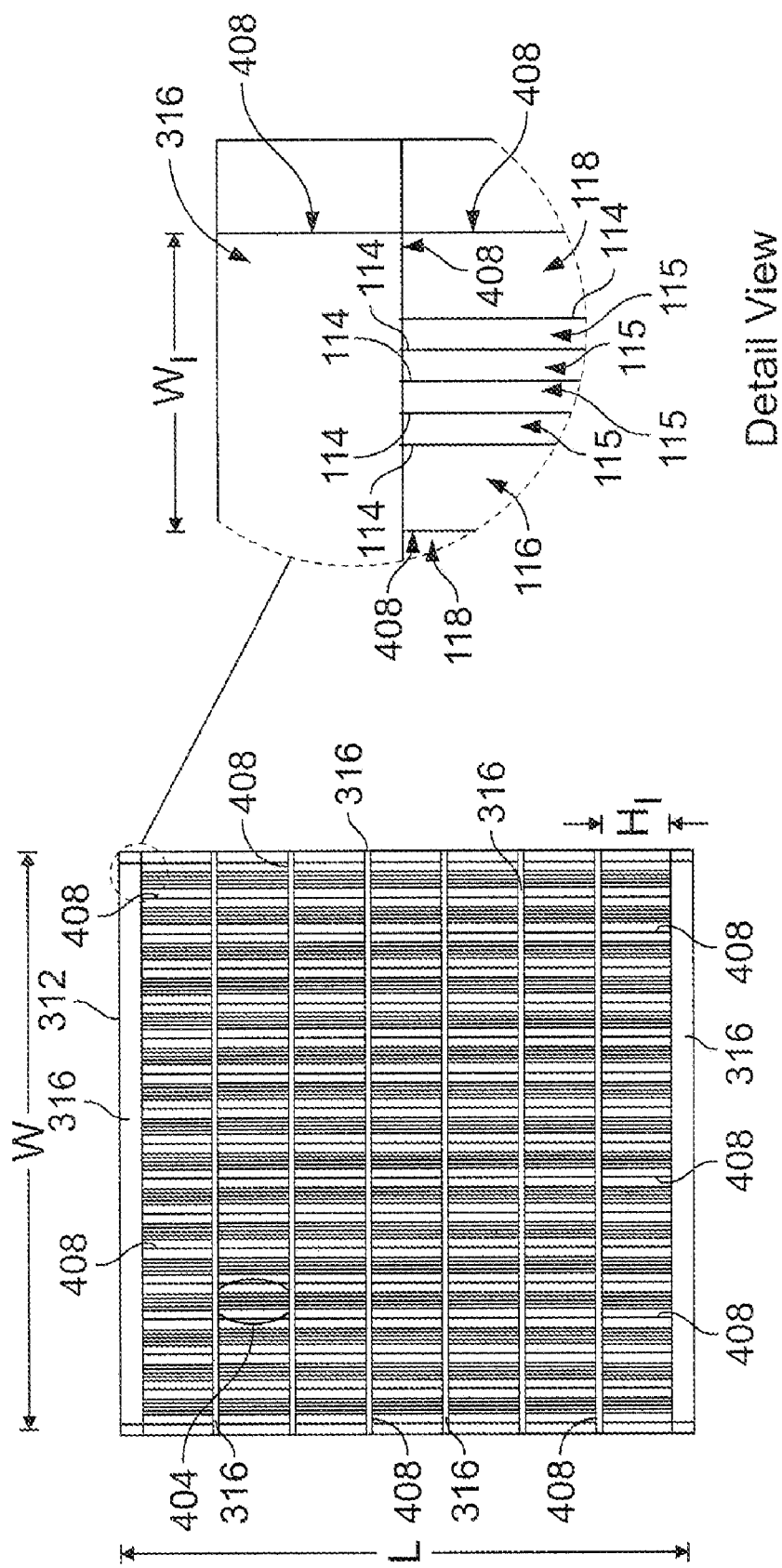
FIG. 7 illustrates a substrate with slits filled (or partially filled) with a binding agent and lines to separate the substrate into I-core elements.

After (or alternatively, before) any necessary surface processing such as cleaning or polishing, the wafer may be cut to yield a plurality of individual core elements as shown in FIG. 7. The support 316 that previously maintained the juxtapositions between first 116 regions, second 118 regions and intermediate regions 115 may be cut away. As shown in FIG. 7, the substrate 312 may be cut and separated along the lines marked 408 removing the portions of the wafer that are not part of the individual core elements. The wafer 312 processed in the above described way may yield approximately 112 (16×7=112) individual I-core elements, each of which is similar to first element 106 shown in FIG. 1. A large quantity of I-core elements may be produced from a large wafer. For example, if the size of the wafer is increased to a width of 12 inches and a length of 12 inches, 1008 individual I-core elements may be fabricated from a single wafer. Accordingly, the cost associated with each manufacturing step may be reduced.

As shown, each horizontally disposed line 408 in FIG. 7 dissects a particular group 404 of slits 114 near an end of the slits 114. Cutting the support 316 away along a line 408 that dissects the slits 114 in a distributed gap section 404 ensures that each slit 114 passes completely through the magnetically permeable material and thus forms a gap in the resulting I-core element (e.g., 106 of FIG. 1). If a cut is made along a horizontally disposed line 408 that does not dissect a group of slits 114, it may be desirable after separating the associated I-core element, to cut, grind and/or polish off additional magnetically permeable material from an end of the resulting I-core element. As shown in the detail view of FIG. 7, each vertically disposed line 408 is positioned approximately 0.238 inches apart from an adjacent vertically disposed line 408. Making cuts in the substrate 312 according to the lines 408 indicated in FIG. 7 may provide a plurality of I-core elements each having a height $H_I$ that may be approximately equal to 0.466 inches and a width $W_I$ that may be approximately 0.238 inches. Referring again to the detail view of FIG. 7, each resulting I-core element may have five slits 114. The method may be used to manufacture a wide variety of distributed gap core elements. For example, the number and spacing of distributed gap sections within a core element; the number and spacing of slits within each distributed gap section; and the overall dimensions of the core element may be varied for each application. Alternatively, longer slits (i.e. having a length that is approximately an integer multiple of the core element width) or fewer lateral support regions 316 may be used yielding a greater number of individual core elements per distributed gap region 404.

Figure 8:
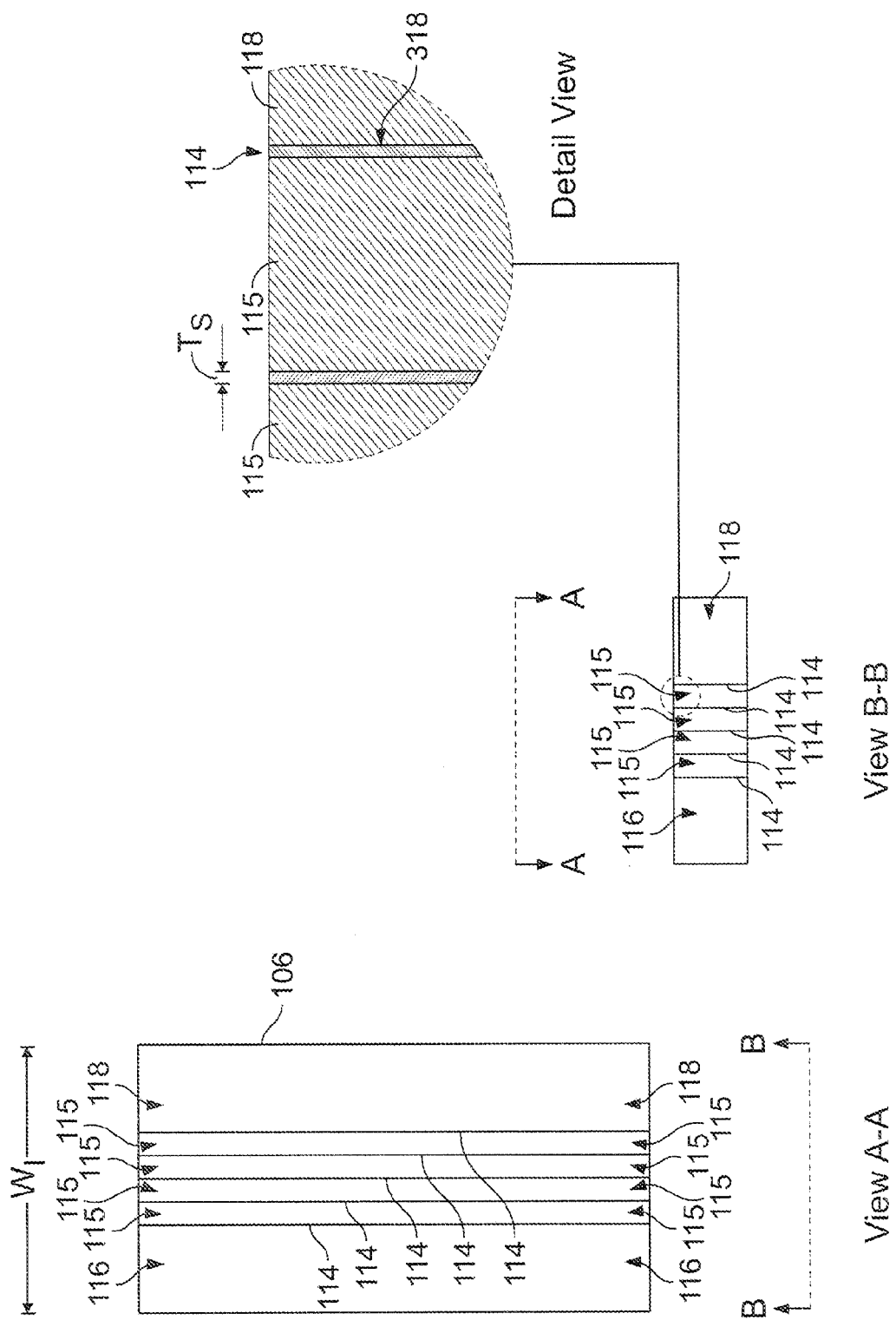
FIG. 8 illustrates an I-core element.

FIG. 8 shows an example of an individual I-core element 106 that may be made using the method outlined in connection with FIGS. 4-7. The I-core element 106 of FIG. 8 may be mated with a matching U-core element to form a closed magnetic loop as shown in FIG. 1.

As a variation of the techniques described with reference to FIGS. 4 through 8 above, support 316 could have been provided as a separate support element (similar to what was shown as 360 in FIG. 3B) adhesively attached to an underside of the substrate in FIG. 4. Such a support element would have been preferably impervious to damage during slit 114 formation in the substrate. With the support element in place, a plurality of slits 114 might have been formed in the substrate, with each slit 114 extending the entire length of the substrate. Since the support 316 would be provided by a separate support element, it might be unnecessary to maintain support regions 316 consisting of substrate material (as was illustrated in FIG. 5). With each slit 114 extending the entire length of the substrate, the pattern of lines 408 cut in the substrate to form individual I-core elements may be different than the pattern shown in FIG. 7. Indeed, the total number of individual I-core elements that could be formed from the substrate illustrated in FIG. 7 might be increased. Additionally, separation of individual I-core elements might occur upon removal of the separate support element from the substrate after the substrate was cut.

Figure 9:
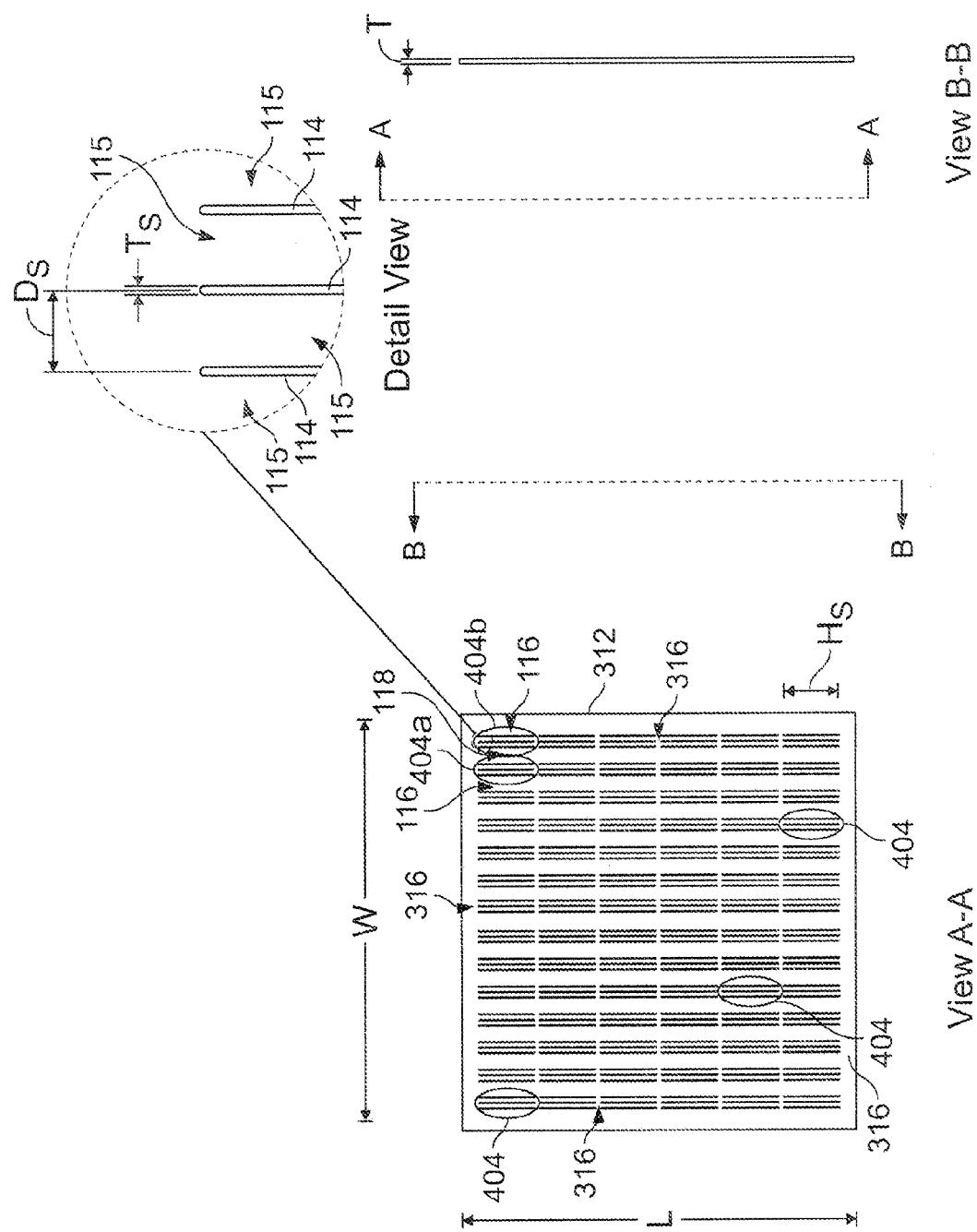
FIG. 9 illustrates a substrate with slits.

An I-core element having two distributed gap sections 112a, 112b (e.g., I-core element 506, FIG. 12.) for use with a mating E-core element as shown in FIG. 13 may be mass produced using the above described methods. Referring to FIGS. 9 through 12 a ferrite wafer 312 is shown following various stages of fabrication. In FIG. 9 the wafer 312 is shown with dimensions similar to those of the wafer in FIGS. 4-7. As shown in FIG. 9, distributed gap sections 404 (groups 404 of slits) may be formed as described above in connection with FIG. 5. The spacing between each pair of adjacent groups 404 (e.g., 404a and 404b) may be altered to match the E-core. The arrangement of groups 404 illustrated in FIG. 9 includes a matrix having 14 columns and 6 rows of groups 404. Accordingly, 42 (14/2×6=42) I-core configurations are represented on the illustrated substrate 312.

According to the illustrated embodiment, each slit 114 may have a thickness $T_s$ of approximately 0.001 inches and a height $H_s$ of approximately 0.560 inches. However, as mentioned above, each slit 114 might be formed to span all or part of the entire length (i.e., 4 inches) of the substrate 312. Also, a particular slit may be thicker or thinner. According to the illustrated embodiment, each slit 114 may be positioned a distance $D_s$ that is approximately 0.008 inches from an adjacent, parallel slit 114 in the same group 404.

Each such I-core configuration may define two first regions 116 of substrate material on each outside portion of the I-core configuration (i.e., outside each group of slits (e.g., 404a and 404b)), and one second region 118 between the two groups of slits (404a, 404b) of the I-core configuration. Support 316 may be provided by a region of substrate 312 material near each slit 114 that maintains the juxtaposition of first regions 116, second regions 118 and intermediate regions 115 while each of the slits 114 are formed and filled (or partially filled).

Figure 10:
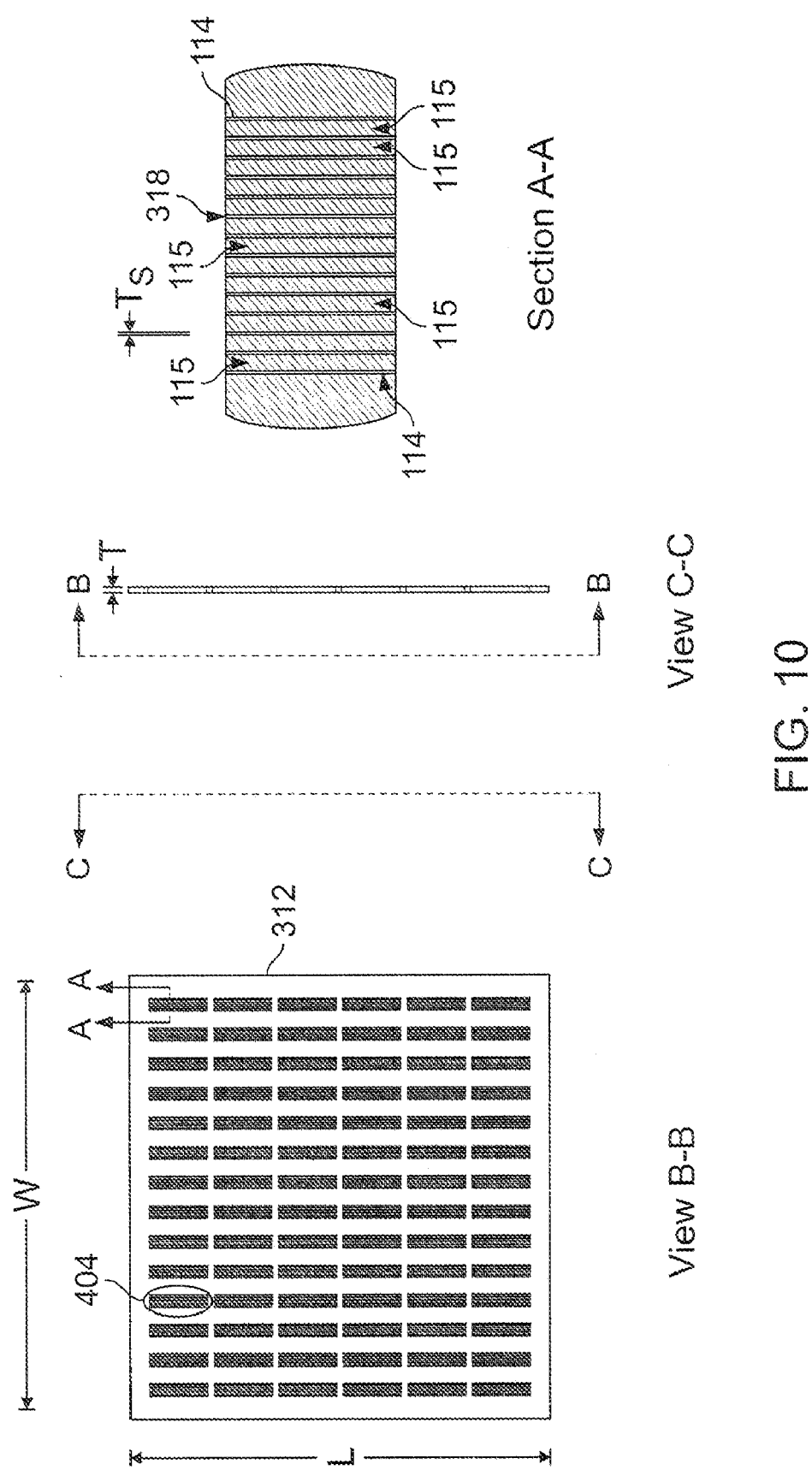
FIG.10 illustrates a substrate with slits filled (or partially filled) with a binding agent.

Turning now to FIG. 10, binding agent 318 is introduced in each slit 114 (step 208). Section A-A of FIG. 10 shows that fourteen slits 114 may be included in each group 404 of slits 114. Accordingly, each I-core configuration may include 28 (14×2) slits 114.

Figure 11:
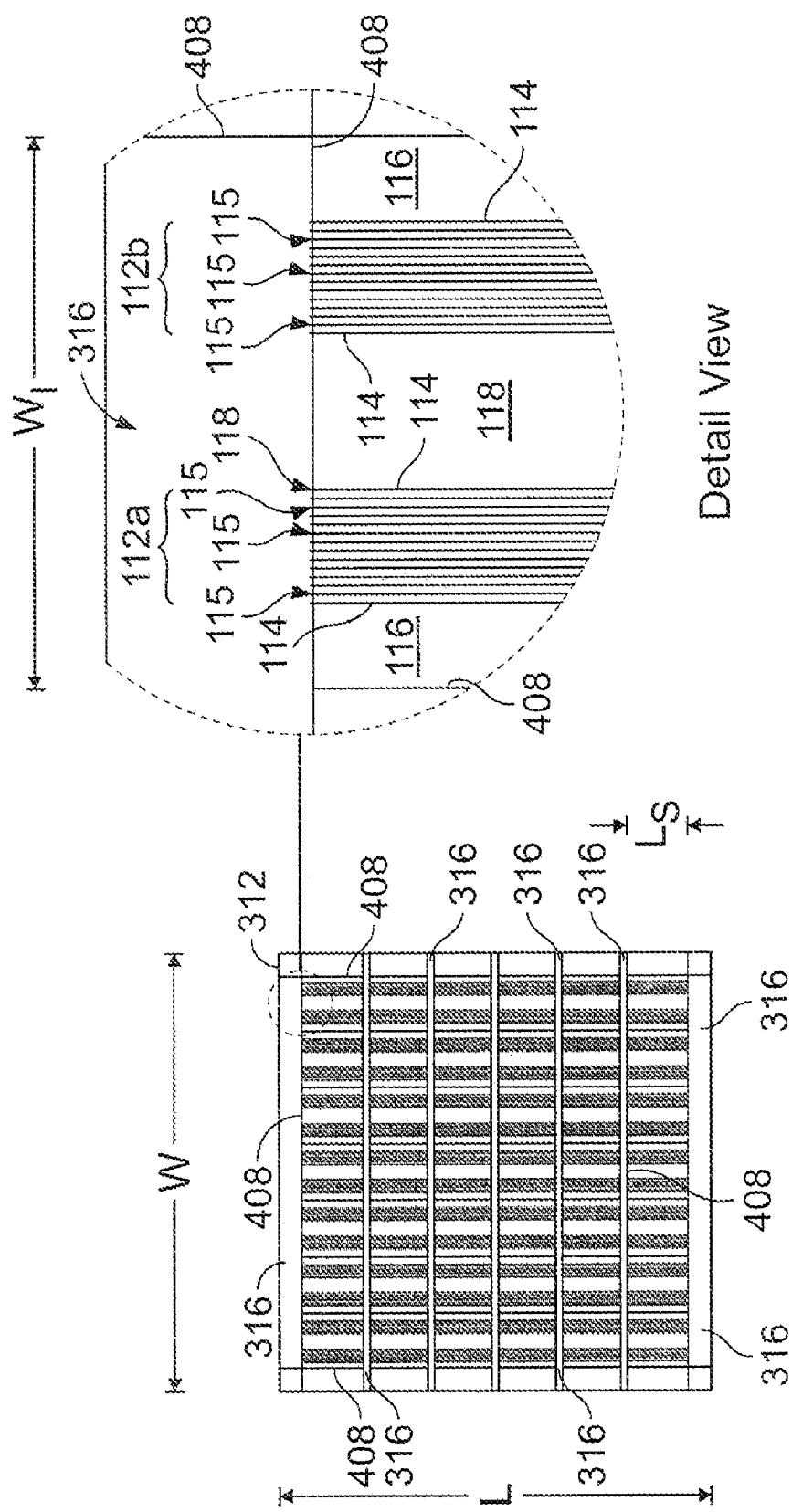
FIG. 11 illustrates a substrate with slits filled (or partially filled) with a binding agent and lines to separate the substrate into I-core elements.

In FIG. 11, the supports 316 that previously maintained the juxtapositions between corresponding first 116, second 118 and intermediate 115 regions may removed by cutting the substrate along lines indicated by 408. Each I-core element thusly formed may include two discretely distributed gap sections 112a, 112b. The vertically disposed lines may be positioned approximately 0.238 inches apart from each other. Such cuts may provide a plurality of I-core elements having dimensions equal to approximately 0.512 inches by 0.550 inches. As can be observed in the detail view of FIG. 11, each resulting I-core element may have twenty-eight slits 114, divided into two sections with fourteen slits 114 in each section. Of course, any number of slits 114 could be accommodated in a given I-core element.

FIG. 12 illustrates an exemplary I-core element 506 that may have been removed from the substrate 312 wafer of FIG. 11. The I-core element 506 may include two distributed gap sections 112a, 112b. A first 116 region may be positioned outside each of the respective distributed gap sections 112a, 112b. A second 118 region may be positioned between the two distributed gap sections 112a, 112b.

FIG. 13 illustrates a magnetic core 502, comprising a first core element 506 and a second core element 508 that forms two closed loops of magnetically permeable material. The first core element 506 may be an I-core element manufactured according to the techniques described above. The second core element 508 may be an E-core element. The core elements 506, 508 may be positioned to contact each other at interfaces 110*a*, 110*b* and 110*c*. One or more of the interfaces 110*a*, 110*b* and 110*c* may be essentially gapless; in preferred embodiments all three of the interfaces may be essentially gapless. Due to the shape of the respective core elements 508 and 506, the illustrated embodiment is known as an EI core. The first core element 506 may include at least some magnetically permeable material and two sections 112*a*, 112*b* of discretely distributed gaps.

It should be understood that each distributed gap section 112*a*, 112*b* could include a greater or lesser number of slits 114, first regions 116 and second regions 118 than are illustrated. The distributed gap sections 112*a*, 112*b* could include an unequal number of gaps. Furthermore, the first core element 506 could include a greater number of distributed gap sections 112*a*, 112*b* than are shown as well.

The printed circuit board 104 may be positioned relative to the magnetic core 502 in such a manner that current flowing in certain parts of the printed circuit board 104 will induce a magnetic field within the magnetic core 502. The magnetic flux that may be generated within the magnetic core 502 is indicated by arrows marked 520.

In the illustrated embodiment, at least 80% of energy associated with the induced magnetic field may be stored in the distributed gap sections 112*a*, 112*b* of the magnetic core 502.

Vinciarelli, U. S. patent application Ser. No. 10/723,768, "Printed Circuit Transformer," assigned to the same assignee as this application and incorporated by reference, describes a transformer that may comprise a gapped magnetic core, the core being linked by windings formed of conductive etches on layers of a printed circuit board. The gapped magnetic core may comprise a pair of U-I core pieces. In application, such transformers may form a portion of a DC-DC converter (e.g., a Sine Amplitude Converter of the kind described in Vinciarelli, "Factorized power architecture with point of load sine amplitude converters," Published U.S. Patent Application No. 20030142513, assigned to the same assignee as this application and incorporated by reference). Such converters may be manufactured in a wide variety of pre-determined models, each model differing from other models in terms of its operating specifications (e.g., input voltage, output voltage, power level). Thus, different DC-DC converter models may comprise transformers that may be configured on the manufacturing line to meet different, pre-determined, specifications. This, in turn, requires that different gaps be set for different transformers. Furthermore, certain DC-DC converter models may require a multiplicity of transformers or inductors having different gap requirements.

Figure 16:
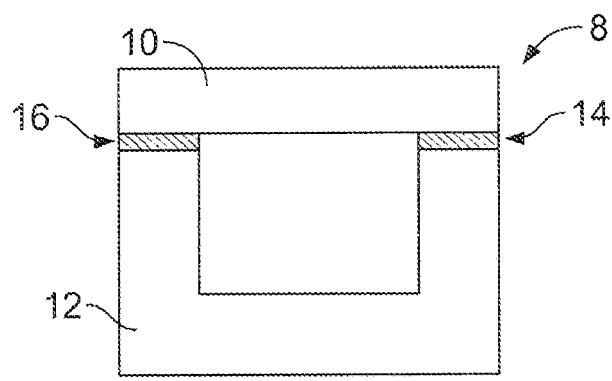
FIG. 16 illustrates a gapped magnetic core formed of two core pieces.

Conventional methods of setting such gaps, described above with reference to FIG. 16, can be costly and time consuming. Setting gaps of differing lengths may require that adhesives of different viscosity be made available and dispensed on the manufacturing line. Gap setting adhesives, whether or not loaded with spherical or other spacers, may require that mechanical support be provided so that gaps between the core pieces are maintained during the cure time of the adhesive, thereby adding cost and taking up unnecessary space. Alternatively, the transformer or inductor (and the product that contains them) may need to remain in a fixture until the adhesive cures and use of an oven may be required to accelerate the cure. A fixture capable of handling a multiplicity of transformers or inductors having different gaps is complex and costly. In any event, such gap-setting methods add cost and cycle time to the manufacturing process and may require that different adhesives be inventoried and dispensed on the manufacturing line.

Use of the present invention may enable a faster and more cost-effective manufacturing method. In an example of the method, a plurality of different I-core pieces, manufactured as described herein to comprise different configurations of discretely distributed gaps, are made available on a manufacturing line. For each model of DC-DC converter being manufactured on the line, appropriate I-core pieces are selected from the plurality of different I-cores and combined with U-core pieces to form magnetic cores having essentially gapless interfaces where the core pieces meet (e.g., at locations 110*a*, 110*b*, 100*c*, FIG. 13). The method may eliminate the need for different adhesives on the manufacturing line and associated fixtures, equipment and cycle time. By this means, a wide variety of transformers may be configured on a manufacturing line in real time without the manufacturing cycle time and product cost penalties associated with older methods of manufacture.

A number of embodiments of the invention have been described. Nevertheless, it will be understood that various modifications may be made without departing from the spirit and scope of the invention. For example, a variety of core configurations may be manufactured according to the techniques disclosed herein. The particular order of steps required to manufacture a magnetic core may vary from situation to situation. Different materials may be used for different applications. The slits may be oriented to be essentially perpendicular to the flux paths defined by the core pieces or the slits may be cut at an angle relative to the core pieces. The wafers need not be flat and may be provided in shapes that define the final geometry (e.g., comprising curved sections) for a particular application.

Accordingly, other embodiments are within the scope of the following claims.

What is claimed is:

1. A method of manufacturing a magnetic core, the method comprising:

providing a unitary substrate including a magnetically permeable material having a first region and a second region proximate the first region, wherein the first region and the second region are in the unitary substrate;

providing support to maintain a juxtaposition between the first region and the second region;

forming a slit in the unitary substrate between the first region and the second region, the slit constituting a gap in a predetermined flux path in a completed core;

introducing a binding agent into the slit; and removing the support;

wherein the binding agent maintains the juxtaposition between the first region and the second region after the support is removed.

2. The method of claim 1 wherein:

the providing support comprises using a portion of the unitary substrate that connects the first region and the second region as a bridge to maintain the juxtaposition between the first region and the second region after the slit is formed; and the removing the support comprises removing the portion of the unitary substrate.

3. The method of claim 1 wherein the forming the slit comprises forming a plurality of slits, each pair of adjacent slits defining an intermediate region of the unitary substrate disposed therebetween.

4. The method of claim 3 wherein the support further maintains a juxtaposition between the first region, the second region and each intermediate region.

5. The method of claim 4 wherein the binding agent maintains the juxtaposition between the first region, the second region and each intermediate region after the support is removed.

6. The method of claim 1 wherein the introducing the binding agent comprises filling the slit.

7. The method of claim 1 further comprising curing the binding agent.

8. The method of claim 1 wherein the unitary substrate comprises a ferrite wafer.

9. The method of claim 8 further comprising polishing at least one surface of the wafer after the filling.

10. The method of claim 1 wherein the forming the slit comprises using a laser.

11. The method of claim 1 further comprising:
   forming a plurality of slits between the first and second region in the unitary substrate;
   wherein the introducing the binding agent comprises introducing the binding agent into each of the plurality of slits.

12. The method of claim 11 wherein each pair of adjacent slits defines an intermediate region of substrate material therebetween, and wherein:
   the support further maintains a juxtaposition between the first region, the second region and each intermediate region.

13. The method of claim 12 wherein:
   the providing support comprises using a portion of the unitary substrate as a bridge to maintain the juxtaposition between the first region, the second region and each intermediate region after the plurality of slits is formed; and
   the removing the support comprises removing the portion of the unitary substrate.

14. The method of claim 11 wherein the forming the plurality of slits comprises forming a plurality of substantially parallel slits, each slit being separated from an adjacent slit by an intermediate region of the unitary substrate.

15. The method of claim 11 further comprising curing the binding agent.

16. The method of claim 1 wherein the unitary substrate comprises a pattern of first regions and second regions, the method further comprising cutting the unitary substrate into a plurality of core pieces each having at least one respective first region, at least one respective second region, and at least one slit between the at least one respective first and at least one respective second regions.

17. The method of claim 16 further comprising:
   forming a closed loop of magnetically permeable material comprising at least one gap in the magnetically permeable material for storing energy, the loop comprising a first element including at least one of the plurality of core pieces, the at least one gap comprising the at least one of the slits, and a second element, and wherein at least 80% of the energy storage is provided by the at least one slit in the at least one of the plurality of core pieces.

18. The method of claim 17 wherein the second element is U shaped.

19. The method of claim 17 wherein the second element is E shaped.

20. The method of claim 16 wherein cutting the unitary substrate into the plurality of core pieces comprises
   cutting the unitary substrate to have a portion forming one of the core pieces, the portion having two respective first regions, the at least one respective second region, and at least two of the slits, wherein
   the at least one respective second region is separated from each of the two respective first regions by at least one of the slits.

21. The method of claim 20 in which the respective second region is separated from each of the two respective first regions by an associated plurality of the slits.

22. The method of claim 21 wherein each slit of the pluralities of slits is filled with the binding agent.

23. The method of claim 1 wherein the binding agent has a magnetic permeability that is equivalent to air.

24. The method of claim 1 wherein the providing support comprises securing a support element to the substrate.

25. The method of claim 24 wherein the securing comprises adhesively bonding the support element to the substrate.

26. The method of claim 25 wherein the support element is largely impervious to damage during slit formation.

* * * * *

UNITED STATES PATENT AND TRADEMARK OFFICE
CERTIFICATE OF CORRECTION

PATENT NO. : 7,353,587 B2 Page 1 of 1
APPLICATION NO. : 10/978609
DATED : April 8, 2008
INVENTOR(S) : Patrizio Vinciarelli and Eva M. Kenny-McDermott It is certified that error appears in the above-identified patent and that said Letters Patent is hereby corrected as shown below:

Column 2, lines 24-27 (approx) please delete "The use of . . . No. 22 (2002)." and insert the same on Column 2, line 25 (approx) as a new paragraph.

Column 6, line 7, delete "core;" and insert --core.-- therefor.

Column 7, line 15, delete "150 C. and 200 C." and insert -- 150° C. and 200° C.-- therefor.

Column 7, line 19, delete "maybe" and insert --may be-- therefor.

Column 7, line 19, delete "instep" and insert --in step-- therefor.

Column 8, line 60, after "FIG. 6" insert --.--.

Column 14, line 22 (Claim 20), after "comprises" please insert --:--.

Signed and Sealed this

Eleventh Day of November, 2008

JON W. DUDAS
*Director of the United States Patent and Trademark Office*